United States Patent [19]

Peters et al.

[11] Patent Number: 5,236,740
[45] Date of Patent: Aug. 17, 1993

US005236740A

[54] METHODS FOR COATING ADHERENT DIAMOND FILMS ON CEMENTED TUNGSTEN CARBIDE SUBSTRATES

[75] Inventors: Michael G. Peters; Robert H. Cummings, both of Santa Clara, Calif.

[73] Assignee: National Center for Manufacturing Sciences, Ann Arbor, Mich.

[21] Appl. No.: 693,234

[22] Filed: Apr. 26, 1991

[51] Int. Cl.$^5$ .................. C23C 16/02; C23C 16/26; C23F 1/26
[52] U.S. Cl. ................... 427/249; 427/255; 427/307; 427/309; 156/651; 156/656
[58] Field of Search ............. 427/255, 249, 248.1, 427/307, 309; 156/651, 656

[56] References Cited

U.S. PATENT DOCUMENTS

| | | | |
|---|---|---|---|
| 3,647,401 | 3/1972 | Meadows | 29/182.8 |
| 4,784,023 | 11/1988 | Dennis | 76/108 A |
| 4,923,512 | 5/1990 | Timm | 75/239 |
| 4,961,780 | 10/1990 | Pennington, Jr. | 75/238 |
| 5,068,148 | 11/1991 | Nakahara et al. | 428/335 |
| 5,100,703 | 3/1992 | Saijo et al. | 427/249 |

FOREIGN PATENT DOCUMENTS

| | | |
|---|---|---|
| 63-053269 | 3/1988 | Japan . |
| 63-100182 | 5/1988 | Japan . |
| 1-201475 | 8/1989 | Japan . |

*Primary Examiner*—Shrive Beck
*Assistant Examiner*—Bret Chen
*Attorney, Agent, or Firm*—Kenneth D'Alessandro

[57] ABSTRACT

A cemented tungsten carbide substrate is prepared for coating with a layer of diamond film by subjecting the substrate surface to be coated to a process which first removes a small amount of the tungsten carbide at the surface of the substrate while leaving the cobalt binder substantially intact. Murakami's reagent is presently preferred. The substrate is then subjected to a process which removes any residue remaining on the surface as a result of the performance of the process which removes the tungsten carbide. A solution of sulfuric acid and hydrogen peroxide is presently preferred. A diamond coated cemented tungsten carbide tool is formed using an unpolished substrate, which may be prepared by etching as described above or by etching in nitric acid prior to diamond film deposition. Deposition of a substantially continuous diamond film may be accomplished by reactive vapor deposition, thermally assisted (hot filament) CVD, plasma-enhanced CVD, or other techniques.

4 Claims, No Drawings

METHODS FOR COATING ADHERENT DIAMOND FILMS ON CEMENTED TUNGSTEN CARBIDE SUBSTRATES

BACKGROUND OF THE INVENTION

1. Field of the Invention

The present invention relates to hard coatings for tools. More particularly, the present invention relates to diamond coated cemented tungsten carbide articles and methods for making diamond coated cemented tungsten carbide articles.

2. The Prior Art

Polycrystalline diamond (PCD) cutting tools, comprising a piece of polycrystalline diamond fastened to the tip of a tool insert are known in the art. These tools are expensive to manufacture and do not readily lend themselves to indexing for increased tool life. In addition, PCD tooling having complex shapes, i.e., taps, drill bits, cannot be formed using any known techniques. PCD tools are typically run at cutting speeds of around 2,500 SFM when cutting materials such as 390 aluminum.

Numerous attempts have been made to provide diamond coated tools which have performance approaching that of PCD tools because they would be less costly to manufacture and use, and because diamond coated tools having more complex shapes than are possible with PCD tools are theoretically manufacturable employing substrates such as cemented tungsten carbide.

A significant challenge to the developers of diamond-coated tooling is to optimize adhesion between the diamond film and the substrate to which it is applied, while retaining sufficient surface toughness in the finished product. Substrates like $Si_3N_4$, and SiAlON can only be formed into a few geometries, limiting their commercial potential. Sintered tungsten carbide (WC) substrates without cobalt or other binders have been studied but can be too brittle to perform satisfactorily as tooling in machining applications.

Cemented tungsten carbide substrates incorporating a cobalt binder in concentrations between about 4% and 6% (WC/Co) have the requisite toughness and thus show the greatest long-term commercial promise for tooling applications. A cemented tungsten carbide substrate with up to 6% cobalt would provide adequate surface toughness for most machining tasks. Cemented tungsten carbide can be formed into a variety of geometries, making it a potential material for drilling operations, die manufacturing, and other applications of value to the automobile and other industries. It is therefore desireable to provide a way to coat cemented tungsten carbide substrates with a layer of diamond film having adequate adhesion to the substrate for use as a machine tool.

It has been reported in the literature that the use of a cobalt binder in cemented carbides inhibits adhesion of the diamond film to the substrate. R. Haubner and B. Lux, Influence of the Cobalt Content in Hot-Pressed Cemented Carbides on the Deposition of Low-Pressure Diamond Layers, *Journal De Physique*, Colloque C5, supplement au no. 5, pp. C5-169-156, Toma 50, May 1989. Indeed, conventional wisdom indicates that successful use of cemented tungsten carbide substrates may only be achieved by utilizing substrates containing no cobalt, as taught in U.S. Pat. No. 4,990,403; no more than 4% Co binder, as taught in U.S. Pat. No. 4,731,296, or by deliberately depleting the cobalt concentration at the surface of the substrate. It is known to deplete the cobalt concentration at the surface of the substrate by selective etching or other methods, M. Yagi, Cutting Performance of Diamond Deposited Tool For Al 18 mass % Si Alloy, *Abst. of 1st Int. Conf. on the New Diamond Sci. & Technol.*, pp. 158-159, Japan New Diamond Forum, 1988., but this decreases the surface toughness of the substrate and can cause chipping of the substrate and applied diamond film. Increased adhesion of diamond to the substrate may be achieved by decarburizing the substrate prior to deposition, as taught in European Patent Application Publication No. 0 384 011, but use of this procedure does not optimize substrate toughness and does not lend itself well to manufacturing environments where repeatability and consistency are important issues.

The prior art teaches polishing or scratching the surface of a cemented tungsten carbide substrate prior to attempting diamond deposition due to the enhancement to the nucleation process caused by scratching and polishing. Haubner and Lux; Yagi; M. Murakawa et al., *Chemical Vapour Deposition of A Diamond Coating Onto A Tungsten carbide Tool Using Ethanol*, Surface Coatings Technology, Vol. 36, pp. 303-310, 1988; Kuo et al., Adhesion and Tribological Properties of Diamond Films on various substrates, *J. Mat. Res.*, Vol. 5, No. 11, November 1990, pp. 2515-2523. These articles either teach use of polished substrates or indicate poor results obtained by utilizing substrates whose surfaces have not been prepared by polishing or scratching.

A promising solution to the adhesion problem has been to employ an interlayer between the diamond and a WC/Co substrate. This encapsulates the Co, optimizing adhesion while allowing the substrate to retain its toughness. It may also be possible to choose an effective interlayer material that bonds strongly to diamond, further increasing adhesion. U.S. Pat. No. 4,707,384 discloses use of a titanium carbide interlayer. U.S. Pat. Nos. 4,998,421 and 4,992,082 disclose utilization of a plurality of layers of separated diamond or diamond like particles interposed with layers of a planarized bonding material.

It would, however, be advantageous to develop a direct diamond coated cemented tungsten carbide article having superior adhesion for machining purposes. A process for producing such a diamond-coated cemented tungsten carbide article would also be desireable.

BRIEF DESCRIPTION OF THE INVENTION

According to a first aspect of the present invention, a cemented tungsten carbide substrate is prepared for coating with a layer of diamond film by subjecting the substrate surface to be coated to a process which first removes a small amount of the tungsten carbide at the surface of the substrate while leaving the cobalt binder substantially intact. The substrate is then subjected to a process which removes any residue remaining on the surface as a result of the performance of the process which removes the tungsten carbide. As presently preferred, the first step of the process is carried out by selectively etching tungsten carbide at the surface of the substrate with Murakami's reagent and the second step of the process is carried out by an etch in a solution of nitric acid in water or a solution of sulfuric acid and hydrogen peroxide.

According to a second aspect of the present invention, a diamond coated cemented tungsten carbide tool is formed using an unpolished substrate. Prior to diamond film deposition, the substrate may be treated according to the first aspect of the invention or may be etched in nitric acid. Diamond film deposition may be accomplished by reactive vapor deposition, thermally assisted (hot filament) CVD, or plasma-enhanced CVD. In a presently preferred embodiment, a plasma-enhanced microwave CVD deposition process is employed at a substrate temperature greater than 900° C.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to a first aspect of the present invention, a method is described for preparing a cemented tungsten carbide substrate for coating with a layer of diamond film. The substrate is first treated by removing a small amount of the tungsten carbide at the surface of the substrate while leaving the cobalt binder substantially intact. In a presently preferred embodiment of the invention, the substrate is first degreased using a standard solvent cleaning step employing, for example, TCA, TCE and/or acetone. The substrate is then rinsed with DI water.

The substrate is then etched to selectively remove tungsten carbide at the surface of the substrate. In a presently preferred embodiment, the etch is performed using Murakami's reagent (10 grams of potassium ferricyanide, 10 grams of potassium hydroxide, and 100 ml of water) for a period greater than two minutes, preferably from about 3-80 minutes. The substrate is then rinsed with DI water.

A second etching step in the process is performed to remove any residue from the Murakami's reagent and some of the cobalt binder. As presently preferred, this step comprises an etch for about 10 seconds in a solution of sulfuric acid and hydrogen peroxide. Etching times as short as 5 seconds in 1-5 volume percent sulfuric acid in solution with hydrogen peroxide and as long as 30 seconds in 50 volume percent sulfuric acid hydrogen peroxide solutions have been used. The substrate is then again rinsed with DI water.

The substrate is then coated with a diamond film. It has been discovered that superior results may be obtained using cemented silicon carbide substrates by leaving the substrate unpolished. Polishing, scratching and otherwise seeding the substrate are not performed prior to diamond deposition according to the present invention. As used herein, "polishing" shall mean polishing, scratching, or seeding the surface of a substrate. An "unpolished" substrate shall refer to a substrate which has not been polished, scratched, or otherwise seeded.

As presently preferred, diamond deposition is performed by microwave plasma-enhanced CVD techniques in an atmosphere of between about 1 to 8% methane at a substrate temperature of between about 900° to 1,000° C., preferably about 950° C., for a period sufficient to form a substantially continuous diamond film layer. It is presently preferred to form a diamond film having a thickness of at least 10 microns, preferably between about 10 to 30 microns, although other thicknesses may be used. Pressures in the reactor vessel should be tailored to maintain a sufficient plasma localized around the substrate without either extinguishing the plasma or allowing it to jump to the vessel wall. At a microwave power of 1,500 watts, a pressure of about 80 torr has been found to be satisfactory, although those of ordinary skill in the art will be able to determine appropriate pressure and power combinations.

While it is presently preferred to deposit the diamond film according to the present invention by using microwave plasma-enhanced CVD techniques, it is believed that other known techniques for depositing diamond films, including but not limited to plasma-enhanced CVD, hot filament CVD and reactive vapor deposition techniques may be used to perform the processes and produce the articles of the present invention.

The following examples are instructive to illustrate the principles of the present invention. Those of ordinary skill in the art will recognize that the scope of the invention is not limited to the particular illustrations given in the examples.

EXAMPLE 1

One unpolished 6% cobalt cemented tungsten carbide substrate comprising a TPG-432A grade H-21 (C-2 class) tool insert from Teledyne Firth Sterling of La Vergne Tennessee was first washed with DI water and then degreased using first TCA and then acetone. The substrate was then etched for six minutes with Murakami's reagent. The substrate was then again washed with DI water. The substrate was then etched for approximately 5 seconds in a solution of 30 volume percent sulfuric acid and 70 volume percent hydrogen peroxide. The substrate was then again rinsed with DI water.

The substrate was then coated with approximately 15 microns of diamond film using microwave plasma-enhanced CVD at a power of 1,500 watts in an atmosphere of 1.8% methane for sixteen hours at a substrate temperature of about 950° C. Compared to untreated substrates, the adhesion of the diamond film to the tungsten carbide substrate was superior to coated substrates which did not undergo the treatment.

EXAMPLE 2

Three unpolished 6% cobalt cemented tungsten carbide substrates comprising a TPG-432A grade H-21 (C-2 class) tool insert were first washed in DI water and then degreased as in Example 1. The first sample was then etched for 30 seconds in 5 volume percent nitric acid and then rinsed with DI water. The second sample (B) was then etched for six minutes in Murakami's reagent. It was then rinsed in DI water. The substrate was then etched for 5 seconds in 50 volume % nitric acid. It was then again rinsed with DI water. The third sample (C) was bead blasted and then etched for 30 seconds in 5 volume percent nitric acid and then rinsed with DI water.

The three substrate were then coated with approximately 20 microns of diamond film using microwave plasma-enhanced CVD at a power of 1,500 watts in an atmosphere of 3% methane for sixteen hours at a substrate temperature of about 950° C. Upon cooling, the diamond films delaminated from samples (A) and (C). The diamond film was adherent to the substrate of sample (B). Sample (B) later successfully turned a sample of 390 aluminum (three passes on a sample measuring 7.25 inches in length and approximately 3.5 inches in diameter at 4,500 SFM, at 0.025 inch depth of cut and 0.005 inch/revolution) without delaminating.

EXAMPLE 3

Three unpolished 6% cobalt cemented tungsten carbide substrates comprising TPG-432A grade H-21 (C-2 class) tool inserts were first rinsed in DI water and then degreased as in Example 1. The first sample (A) received no further substrate preparation prior to diamond deposition. The second sample (B) was then etched for four minutes in concentrated nitric acid and then rinsed in nitric acid. The third sample (C) was polished with 0.1 micron diamond powder. It was then rinsed in DI water and rubbed with a glove to remove any loose debris.

The three substrates were then coated with approximately 15 microns of diamond film using microwave plasma-enhanced CVD at a power of 1,500 watts in an atmosphere of 1.8% methane for sixteen hours at a substrate temperature of about 950° C. Upon cooling, the diamond films were adherent to substrates (A) and (B), while the diamond film delaminated from substrate (C). Both samples (A) and (B) and later turned a sample liner of 390 aluminum (one pass at 2,000 SFM, 0.025 inch depth of cut, 0.005 inch/revolution, 10 inch length and approximately 3.5 inches in diameter) without film delamination. Sample (B) subsequently turned an additional nine passes on 390 aluminum at 2,500 SFM, 0.025 inch depth of cut, 0.005 inch/revolution, 7.5 inches in length and approximately 3.5 inches in diameter without failure.

EXAMPLE 4

Three unpolished 6% cobalt cemented tungsten carbide substrates comprising TPG-432A grade H-21 (C-2 class) tool inserts were first rinsed in DI water and then degreased as in Example 1. They were then etched for 30 seconds in 5 volume percent nitric acid. The first sample (A) received no further substrate preparation prior to diamond deposition. The second sample (B) was then polished with 0.1 micron diamond powder. It was then rinsed in DI water and rubbed with a glove to remove any loose debris. The third sample (C) was polished with 0.1 micron diamond powder. It was then rinsed in DI water and agitated in an ultrasonic cleaner to remove any loose debris. No glove touched the region of the substrate on which diamond was to be deposited.

The three substrates were then coated with approximately 15 microns of diamond film using microwave plasma-enhanced CVD at a power of 1,500 watts in an atmosphere of 2.4% methane for thirteen hours at a substrate temperature of about 950° C. Upon cooling, the diamond film was adherent to substrate (A), while the diamond films delaminated from substrates (B) and (C).

EXAMPLE 5

Two unpolished 6% cobalt cemented tungsten carbide substrates comprising TPG-432A grade H-21 (C-2 class) tool inserts were first rinsed in DI water and then degreased as in Example 1.

The first substrate was then coated with approximately 15 microns of diamond film using microwave plasma-enhanced CVD at a power of 1,500 watts in an atmosphere of 1.8% methane for sixteen hours at a substrate temperature of about 950° C. Upon cooling, the diamond film was adherent to the substrate. The insert subsequently turned 390 aluminum without film delamination.

The second substrate was coated with approximately 8 microns of diamond film using microwave plasma-enhanced CVD at a power of 1,200 watts in an atmosphere of 1.8% methane for sixteen hours at a substrate temperature of about 850° C. Upon cooling, the diamond film delaminated from the second substrate.

EXAMPLE 6

An unpolished 6% cobalt cemented tungsten carbide substrate comprising TPG-432A grade H-21 (C-2 class) tool inserts was first rinsed in DI water and then degreased as in Example 1. The substrate was then etched for ten minutes with Murakami's reagent and then rinsed with DI water. The substrate was then etched for 30 seconds in a solution of 30 volume percent sulfuric acid and 70 volume percent hydrogen peroxide. The substrate was then rinsed with DI water.

The substrate was then coated with approximately 25 microns of diamond film using microwave plasma-enhanced CVD at a power of 1,100 watts in an atmosphere of 1.8% methane for sixteen hours at a substrate temperature of about 950° C. The film was adherent upon cooling. The insert subsequently turned uninterrupted cuts on a piece of 390 aluminum 7.25 inches in length, 3.5 inches in diameter having two half inch wide lengthwise slots machined into it (three passes at 660 SFM and a single pass at 1,000 SFM, with a 0.020 inch depth of cut, 0.004 inch/revolution) without film delamination.

Generally, use of the substrate preparation procedure of the present invention allows deposition of thicker diamond films on cemented tungsten carbide substrates without delamination. Films of thicknesses up to 50 microns have been successfully deposited using the methods of the present invention. Without this treatment, it is difficult to grow films thicker than about 20 microns without delamination problems.

As can be seen from the examples set forth herein, it has been discovered that polishing of substrates prior to deposition (Substrate (C) in Example 3 and both substrates (B) and (C) in Example 4) results in weakly adhered films which easily delaminate. In addition, it has been discovered that etching of the substrate in Murakami's reagent followed by etching in a solution of 30 volume percent sulfuric acid and 70 volume percent hydrogen peroxide prior to deposition result in superior films. It is believed that this treatment may be characterized as a removal of a small amount of the tungsten carbide at the surface of the substrate while leaving the cobalt binder substantially intact, followed by removal of any residue from the Murakami's reagent and some of the cobalt binder. Finally, even without the above-described treatment, it has been discovered that etching of an unpolished substrate in nitric acid prior to deposition results in improved adhesion of the diamond film.

The performance results reported in the prior art for diamond coated cemented tungsten carbide tools include results obtained employing cutting speeds of from about 660 to about 1,020 SFM. These speeds fall substantially short of the typical cutting speeds encountered with PCD tools. As demonstrated in the examples included herein, the cutting speeds of the diamond coated cemented tungsten carbide articles made as disclosed herein are substantially higher than those reported in the prior art, and are comparable to the typical PCD tool cutting speeds. Example 6 demonstrates successful interrupted cutting using the tools of the present invention, a feat not reported in the literature for diamond coated tools. The slower cutting speeds used in the example are similar to the slower cutting speeds used for interrupted cutting with PCD tools.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A process for coating an unpolished cemented tungsten carbide substrate with a diamond film, comprising the steps of:

performing a first etching step comprising etching an unpolished cemented tungsten carbide substrate in Murakami's reagent;

performing a second etching step comprising etching said unpolished substrate in a solution of sulfuric acid and hydrogen peroxide;

depositing a substantially continuous diamond film on a selected portion of said surface of said unpolished substrate.

2. A process for coating an unpolished cemented tungsten carbide substrate with a diamond film, comprising the steps of:

performing a first etching step comprising etching an unpolished cemented tungsten carbide substrate in Murakami's reagent;

performing a second etching step comprising etching said unpolished substrate in a solution of sulfuric acid and hydrogen peroxide;

depositing a substantially continuous CVD polycrystalline diamond film on a selected portion of said surface of said unpolished substrate.

3. The process of claim 1 wherein said first etching step comprises an etch in a solution comprising 10 grams of potassium ferricyanide and 10 grams of potassium hydroxide per 100 ml of water for a period greater than about two minutes and wherein said second etching step comprises an etch in a solution of about 30 volume percent sulfuric acid and about 70 volume percent hydrogen peroxide for a period greater than about 5 seconds.

4. The process of claim 2 wherein said first etching step comprises an etch in a solution comprising 10 grams of potassium ferricyanide and 10 grams of potassium hydroxide per 100 ml of water for a period greater than about two minutes and wherein said second etching step comprises an etch in a solution of about 30 volume percent sulfuric acid and about 70 volume percent hydrogen peroxide for a period greater than about 5 seconds.

* * * * *